United States Patent
Matsuura et al.

(10) Patent No.: US 8,105,701 B2
(45) Date of Patent: Jan. 31, 2012

(54) ORGANIC ELECTROLUMINESCENT DEVICE

(75) Inventors: Masahide Matsuura, Sodegaura (JP);
Chishio Hosokawa, Sodegaura (JP);
Toshihiro Iwakuma, Sodegaura (JP);
Keiko Yamamichi, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 13/020,070

(22) Filed: Feb. 3, 2011

(65) Prior Publication Data

US 2011/0121277 A1    May 26, 2011

Related U.S. Application Data

(63) Continuation of application No. 10/588,786, filed as application No. PCT/JP2005/001802 on Feb. 8, 2005, now Pat. No. 7,906,226.

(30) Foreign Application Priority Data

Feb. 13, 2004  (JP) .................................. 2004-036051

(51) Int. Cl.
*H01L 51/54* (2006.01)
*H01L 33/26* (2006.01)

(52) U.S. Cl. ........ 428/690; 428/917; 313/504; 313/506; 257/40; 257/102; 257/103

(58) Field of Classification Search .................. 428/690, 428/917; 313/504, 506; 257/40, 102, 103, 257/E51

See application file for complete search history.

(56) References Cited

U.S. PATENT DOCUMENTS

| | | | |
|---|---|---|---|
| 6,310,360 | B1 | 10/2001 | Forrest et al. |
| 6,515,298 | B2 | 2/2003 | Forrest et al. |
| 6,894,307 | B2 | 5/2005 | Forrest et al. |
| 6,995,509 | B2 | 2/2006 | Yamazaki et al. |
| 7,009,338 | B2 | 3/2006 | D'Andrade et al. |
| 7,285,907 | B2 | 10/2007 | D'Andrade et al. |
| 7,345,300 | B2 | 3/2008 | Qin et al. |
| 7,504,771 | B2 | 3/2009 | Yamazaki et al. |
| 7,608,993 | B2 | 10/2009 | Matsuura et al. |
| 7,611,779 | B2 | 11/2009 | Kanno et al. |
| 7,795,799 | B2 | 9/2010 | Mishima |
| 7,888,865 | B2 | 2/2011 | Iwakuma et al. |
| 2001/0053462 | A1 | 12/2001 | Mishima |

(Continued)

FOREIGN PATENT DOCUMENTS

JP    63-295695    12/1988

(Continued)

OTHER PUBLICATIONS

Tokito et al. Appl. Phys. Lett. vol. 83(12), 2003, 2459-2461.*

(Continued)

*Primary Examiner* — David W Wu
*Assistant Examiner* — Vu A Nguyen
(74) *Attorney, Agent, or Firm* — Oblon, Spivak, McClelland, Maier & Neustadt, L.L.P.

(57) ABSTRACT

An organic EL device 100 including a plurality of emitting layers (15) and (17) between a cathode (18) and (19) and an anode (12), each of the emitting layers (15) and (17) made of a host material having a triplet energy gap of 2.52 eV or more and 3.7 eV or less, and a dopant having a light emitting property related to a triplet state, the dopant containing a metal complex with a heavy metal.

12 Claims, 1 Drawing Sheet

U.S. PATENT DOCUMENTS

| | | |
|---|---|---|
| 2002/0008233 A1 | 1/2002 | Forrest et al. |
| 2002/0041162 A1 | 4/2002 | Tsujioka et al. |
| 2002/0197511 A1 | 12/2002 | D'Andrade et al. |
| 2003/0178619 A1 | 9/2003 | Forrest et al. |
| 2003/0189401 A1 | 10/2003 | Kido et al. |
| 2005/0006641 A1 | 1/2005 | Tung et al. |
| 2005/0077817 A1 | 4/2005 | Yamazaki et al. |
| 2005/0127823 A1 | 6/2005 | Iwakuma et al. |
| 2005/0282036 A1 | 12/2005 | D'Andrade et al. |
| 2006/0164006 A1 | 7/2006 | Yamazaki et al. |
| 2007/0013295 A1 | 1/2007 | Matsuura et al. |
| 2007/0052346 A1 | 3/2007 | Iwakuma et al. |
| 2007/0054151 A1 | 3/2007 | Iwakuma et al. |
| 2007/0108898 A1 | 5/2007 | Matsuura et al. |
| 2007/0194701 A1 | 8/2007 | Ito et al. |
| 2007/0257600 A1 | 11/2007 | Matsuura et al. |
| 2007/0296328 A1 | 12/2007 | Matsuura et al. |
| 2009/0174308 A1 | 7/2009 | Yamazaki et al. |

FOREIGN PATENT DOCUMENTS

| | | |
|---|---|---|
| JP | 2001-313180 | 11/2001 |
| JP | 2001-319779 | 11/2001 |
| JP | 2001-319780 | 11/2001 |
| JP | 2002-100470 | 4/2002 |
| JP | 2002-100471 | 4/2002 |
| JP | 2003-520391 | 7/2003 |
| JP | 2003-264086 | 9/2003 |
| JP | 2003-272860 | 9/2003 |
| JP | 2003-317966 | 11/2003 |
| JP | 2004-522276 | 7/2004 |
| JP | 2004-311420 | 11/2004 |
| JP | 2005-104971 | 4/2005 |
| JP | 2008-524848 | 7/2008 |
| JP | 2010-530640 | 9/2010 |
| WO | 00/27946 | 5/2000 |
| WO | 02/091814 | 11/2002 |
| WO | 03/100880 A2 | 12/2003 |
| WO | WO 2004/060026 | 7/2004 |

OTHER PUBLICATIONS

D'Andrade, Brain W. et al., "Controlling Exciton Diffusion in Multilayer White Phosphorescent Organic Light Emitting Devices", Advanced Materials, vol. 14, No. 2, pp. 147-151, 2002.

Holmes, R. J. et al., "Blue Organic Electrophosphorescence using exothermic host-guest energy transfer", Applied Physics Letters, vol. 82, No. 15, pp. 2422-2424, 2003.

Tokito, Shizuo, et al., "Confinement of Triplet Energy on Phosphorescent Molecules for Highly-efficient Organic Blue-light-emitting Devices", Applied Physics Letters, vol. 83, No. 3, pp. 569-571, 2003.

Tsutsui, Tetsuo et al., "High Quantum Efficiency in Organic Light-Emitting Devices with Iridium-Complex as a Triplet Emissive Center", Jpn. J. Appl. Phys., vol. 38, pp. L1502-L1504, 1999.

Park, et al., Applied Physics Letters, vol. 92, 113308, pp. 113308-1 through 113308-3 (2008).

Kim, et al., Journal of Luminescence, vol. 128, pp. 2035-2037 (2008).

Pode, et al., J. Phys. D: Appl. Phys., vol. 43, 025101, pp. 1-5 (2010).

Meerheim, et al., Proc. of SPIE, vol. 6192, pp. 61920P-1 through 61920P-16 (2006).

"Organic Light-Emitting Materials and Devices", edited by Zhigang Li and Hong Meng, CRC Press, Title page (front and back and p. 335 (2007).

U.S. Appl. No. 13/142,091, filed Jun. 24, 2011, Iwakuma, et al.

Office Action issued Sep. 6, 2011, in Japanese Patent Application No. 2005-517938.

* cited by examiner

ORGANIC ELECTROLUMINESCENT DEVICE

This is a continuation application of U.S. application Ser. No. 10/588,786, filed Jan. 19, 2007, which is a 371 of PCT/JP05/001802 filed on Feb. 8, 2005.

TECHNICAL FIELD

The invention relates to an organic electroluminescent device (hereinafter abbreviated as "organic EL device"). More particularly, the invention relates to a highly efficient organic EL device.

BACKGROUND ART

An organic EL device using an organic substance is a promising solid-state emitting type inexpensive and large full-color display device, and has been extensively developed. An EL device generally includes an emitting layer and a pair of opposing electrodes holding the emitting layer therebetween.

In the EL device, electrons and holes are injected into the emitting layer from a cathode and an anode respectively upon application of an electric field between the electrodes. The electrons and the holes recombine in the emitting layer to produce an excited state, and the energy is emitted as light when the excited state returns to the ground state whereby the EL device emits light.

Various configurations have been known as the configuration of the organic EL device. For example, use of an aromatic tertiary amine as a material for a hole-transporting layer has been disclosed for an organic EL device having the device configuration of "indium tin oxide (ITO)/hole-transporting layer/emitting layer/cathode" (see JP-A-63-295695). This device configuration achieves a high luminance of several hundreds cd/m² at an applied voltage of 20 V or less.

It has been reported that an emission efficiency of about 40 lm/W or more is achieved at a luminance equal to or less than several hundreds cd/m² by using an iridium complex (phosphorescent dopant) as a dopant for an emitting layer (see Tsutsui et al., "Japanese Journal of Physics", Vol. 38 (1999), p. 1502-1504).

However, since most phosphorescent organic EL devices emit green light, a phosphorescent organic EL device which emits blue light in various colors has been demanded. Moreover, an increase in the efficiency of the phosphorescent organic EL device has also been demanded.

When applying the organic EL device to a flat panel display or the like, the organic EL device is required to exhibit improved emission efficiency and reduced power consumption. However, the above-mentioned device configuration has a disadvantage in that the emission efficiency significantly decreases accompanying an increase in luminance. Therefore, it is difficult to reduce the power consumption of the flat panel display.

The invention was achieved in view of the above-described situation. An object of the invention is to provide a phosphorescent organic EL device which exhibits high current efficiency and high luminous efficiency.

DISCLOSURE OF THE INVENTION

According to the invention, the following organic EL device is provided.
1. An organic EL device containing a plurality of emitting layers between a cathode and an anode, each of the emitting layers made of a host material having a triplet energy gap of 2.52 eV or more and 3.7 eV or less, and a dopant having a light emitting property related to a triplet state, the dopant containing a metal complex with a heavy metal.
2. The organic EL device according to 1, wherein the host materials of the emitting layers differ from each other.
3. The organic EL device according to 1 or 2, wherein the host material of at least one of the emitting layers is an organic compound containing a carbazolyl group.
4. The organic electroluminescent device according to any one of 1 to 3, wherein the host material of at least one of the emitting layers is an organic compound containing a carbazolyl group and a trivalent hetero ring containing nitrogen.
5. The organic EL device according to any one of 1 to 4, wherein the host materials forming the emitting layers differ from each other in ionization potential or electron affinity.
6. The organic EL device according to any one of 1 to 5, wherein the host materials of the emitting layers differ from each other in ionization potential or electron affinity by 0.2 eV or more.
7. The organic EL device according to any one of 1 to 6, wherein the emitting layers are stacked in contact with each other.
8. The organic EL device according to any one of 1 to 7, wherein the optical energy gap of the host material forming an emitting layer is equal to or smaller than the optical energy gap of the host material forming the emitting layer adjacent in a direction of the anode.
9. The organic EL device according to any one of 1 to 8, wherein an emitting layer containing a host material with a superior hole-transporting property and an emitting layer containing a host material with a superior electron-transporting property are stacked.
10. The organic EL device according to any one of 1 to 9, wherein at least one of the emitting layers comprises a plural types of the dopants having a light emitting property related to a triplet state.
11. The organic EL device according to any one of 1 to 10, wherein the emitting layer nearest to the cathode contains a first dopant that is different from the dopant having a light emitting property related to a triplet state.
12. The organic EL device according to 11, wherein the first dopant is a metal complex.
13. The organic EL device according to 11 or 12, wherein when the device comprises an electron-transporting layer, the electron affinity of the first dopant is in a range between the electron affinity of an electron-transporting material forming the electron-transporting layer and the electron affinity of the host material of the emitting layer nearest to the cathode, and when the device does not comprise an electron-transporting layer, the electron affinity of the first dopant is in a range between the work function of a cathode material and the electron affinity of the host material of the emitting layer nearest to the cathode.

The invention provides, a phosphorescent organic EL device, particularly emitting light in a blue region, which exhibits high current efficiency and high luminous efficiency.

BEST MODE FOR CARRYING OUT THE INVENTION

Figure 1:
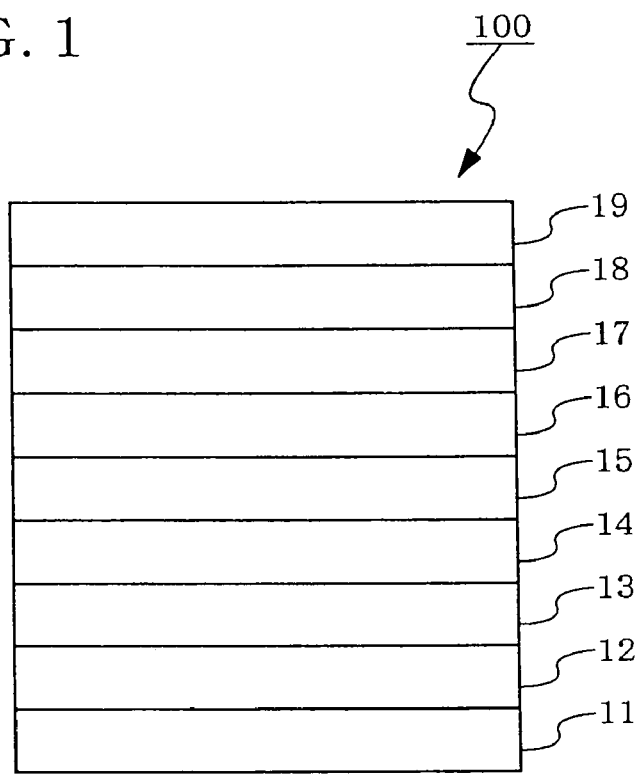
FIG. 1 is a view showing an organic EL device according to Example 1.

An organic EL device according to the invention includes a plurality of emitting layers between a cathode and an anode.

It is preferable that a host material of each emitting layer differ from each other. The number of interfaces between emitting layers is increased by providing a plurality of emitting layers. Since charges are accumulated around the interfaces, recombination probability can be increased. Moreover, since the area in which the luminescent dopant described later exists is increased, the emission region is increased. As a result, current efficiency can be increased.

In the organic EL device according to the invention, the host material forming the emitting layer has a triplet energy gap ($\mu g^T$) of 2.52 eV or more and 3.7 eV or less, preferably 2.75 eV or more and 3.7 eV or less, still more preferably 2.80 eV or more and 3.7 eV or less, and even more preferably 2.90 eV or more and 3.7 eV or less. A host material having a triplet energy gap within the above range allows the device to efficiently emit light irrespective of the color (blue to red) of a luminescent dopant.

In the organic EL device according to the invention, each emitting layer includes a luminescent dopant having a light emitting property related to a triplet state and including a metal complex containing a heavy metal.

The presence of such a luminescent dopant allows emission from the triplet state to contribute to EL emission, whereby the current efficiency is increased.

In the organic EL device according to the invention, the emitting layers may be adjacently stacked. The organic EL device according to the invention may include an intermediate layer (e.g. charge adjustment layer) between the emitting layers. The material for the intermediate layer is not particularly limited insofar as the material exhibits a charge transporting property. An inorganic conductive oxide layer or an organic material known as a charge transporting material or an emitting material may be used. The term "charge transporting property" means that a signal caused by each charge can be measured by a hole or electron mobility measurement method described later. A host material, hole transporting material, and electron transporting material described later may also be used. It is preferable that the intermediate layer have a thickness equal to or less than the thickness of the emitting layer.

It is preferable that the host material of each emitting layers differs from each other. It is more preferable that the host material of an emitting layer relatively near the anode be an organic compound containing at least one carbazolyl group. It is still more preferable that the host material of an emitting layer closer to the cathode than the emitting layer including the host material which is an organic compound containing at least one carbazolyl group be an organic compound containing a carbazolyl group and a trivalent hetero ring containing nitrogen.

It is preferable that the difference in ionization potential (Ip) or electron affinity (Af) between the host materials of the emitting layers be 0.2 eV or more, and still more preferably 0.3 eV or more.

This improves accumulation of charges, whereby high current efficiency or luminous efficiency can be realized.

In the organic EL device according to the invention, it is preferable that an emitting layer formed of a host material with a superior hole transporting property and an emitting layer formed of a host material with a superior electron transporting property be stacked. It is still more preferable that the emitting layers formed of such host materials be alternately stacked.

This improves accumulation of charges, whereby high current efficiency or luminous efficiency can be realized.

In the invention, the term "superior hole transporting property" means that "hole mobility is greater than electron mobility", and the term "superior electron transporting property" means that "electron mobility is greater than hole mobility".

The hole or electron mobility measurement method is not particularly limited. As specific examples of the hole or electron mobility measurement method, a time of flight method (method which calculates the mobility from measured charge transit time in an organic film), a method in which the mobility is calculated from the voltage characteristics of the space limited current, and the like can be given. In the time of flight method, light having a wavelength absorbed by the organic layer mentioned below is applied to a structure including "electrode/organic layer (layer formed of organic material forming electron transporting layer or hole transporting layer)/electrode" to measure the transient current time properties (transit time), and the electron or hole mobility is calculated using the following expression.

Mobility=(thickness of organic film)$^2$/(transit time·applied voltage)

Field intensity=(voltage applied to device)/(thickness of organic layer)

Note that methods disclosed in Electronic Process in Organic Crystals (M. Pope, C. E. Swenberg), Organic Molecular Solids (W. Jones), and the like may also be used.

It is preferable that the host materials of the individual emitting layers differ in ionization potential (Ip) or electron affinity (Af).

This improves accumulation of charges, whereby high current efficiency or luminous efficiency can be realized.

It is preferable that the host material forming an emitting layer have an optical energy gap (Eg) equal to or smaller than the optical energy gap (Eg) of the host material forming the emitting layer adjacent in the direction of the anode. That is, it is preferable that emitting layers whose number is "N" satisfy the following relationship.

$$Eg(N) \leq Eg(N-1) \leq \ldots \leq Eg(2) \leq Eg(1) \qquad (I)$$

Eg (x): optical energy gap of x-th (x is an integer of 1 or more and N or less) emitting layer from the anode side It is preferable that the host material forming an emitting layer have a triplet energy gap ($Eg^T$) equal to or smaller than the triplet energy gap ($Eg^T$) of the host material forming the emitting layer adjacent in the direction of the anode. That is, it is preferable that emitting layers whose number is "N" satisfy the following relationship.

$$Eg^T(N) \leq Eg^T(N-1) \leq \ldots \leq Eg^T(2) \leq Eg^T(1) \qquad (II)$$

$Eg^T$ (x): triplet energy gap of x-th (x is an integer of 1 or more and N or less) emitting layer from the anode side If the relationship shown by the expression (I) or (II) is satisfied, the recombination energy can be efficiently stored in the emitting layers to contribute to emission, whereby a device exhibiting a high current efficiency can be realized.

In the organic EL device according to the invention, the host materials and the luminescent dopants forming the emitting layers are not particularly limited insofar as the above conditions are satisfied.

As the host material, a compound having a carbazolyl group is preferable. It is preferable to form a stacked structure or a multilayer structure of a hydrocarbon derivative of an organic compound having a carbazolyl group, and an electron-attracting substituent derivative of an organic compound having a carbazolyl group or a nitrogen-containing derivative of an organic compound having a carbazolyl group. A fluorine-containing derivative may be used instead of the nitrogen-containing derivative.

As specific examples of the compound having a carbazolyl group, compounds disclosed in JP-A-10-237438, Japanese Patent Application No. 2003-042625, Japanese Patent Application No. 2002-071398, Japanese Patent Application No. 2002-081234, Japanese Patent Application No. 2002-299814, Japanese Patent Application No. 2002-360134, and the like can be given. Specific compounds are given below.

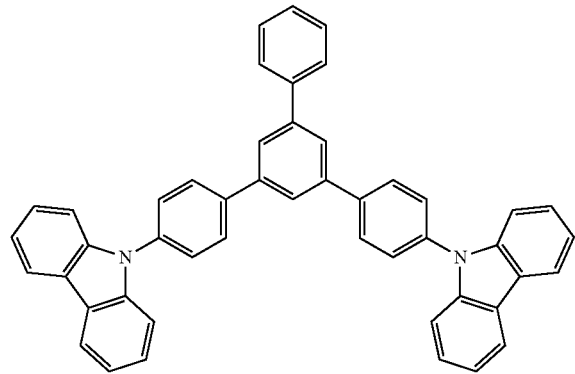

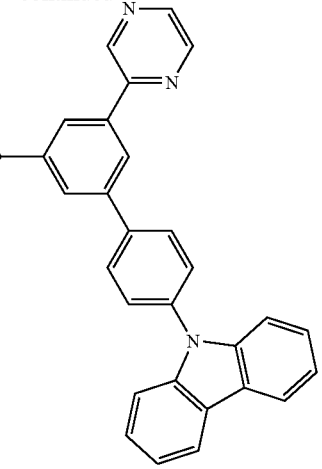

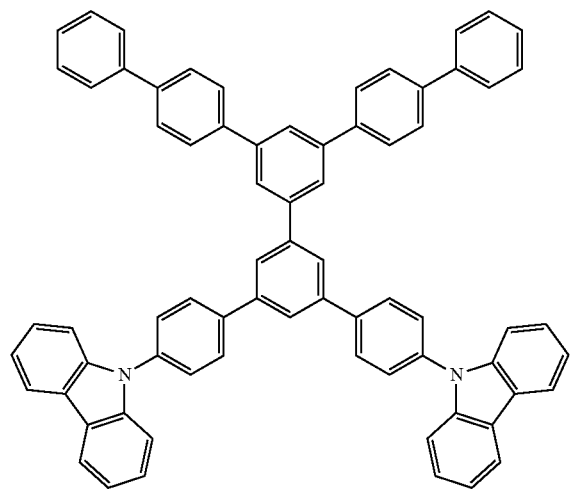

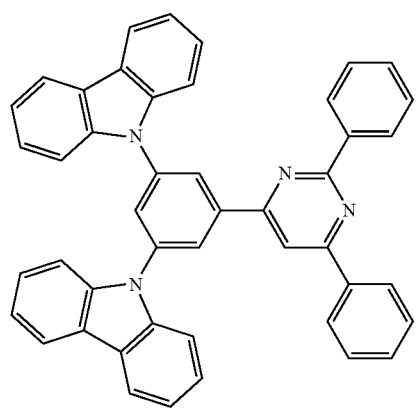

A compound having a carbazolyl group (described later) which may be used as the electron transporting material may also be used as the host material.

As examples of the host material exhibiting an excellent hole transporting property, compounds disclosed in JP-A-10-237438 and Japanese Patent Application No. 2003-042625 can be given. As examples of the host material exhibiting an excellent electron transporting property, compounds disclosed 2002-299814, and Japanese Patent Application No. 2002-360134 can be given.

The host material may be a compound given below.

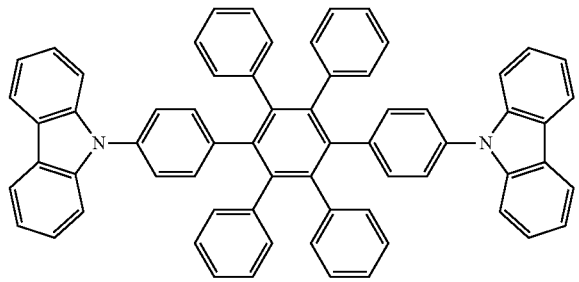

It is preferable that the luminescent dopant function as a dopant which emits light due to the triplet state at room temperature. As preferable examples of the heavy metal contained in the luminescent dopant, Ir, Pt, Pd, Ru, Rh, Mo, and Re can be given. As examples of the ligand coordinated to the heavy metal, a ligand which is coordinated or bonded to a metal at C or N(CN ligand) and the like can be given. As specific examples of such a ligand, the following compounds and substituted derivatives thereof can be given.

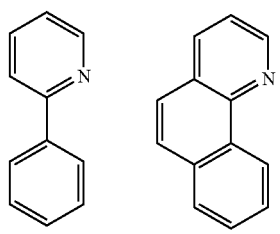

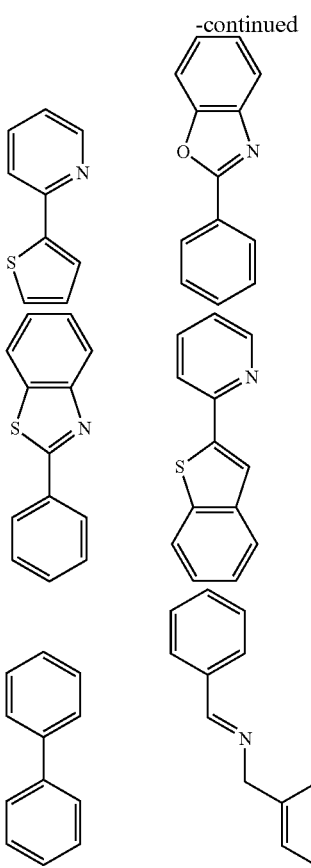

As examples of the substituent for the substituted derivatives, an alkyl group, alkoxy group, phenyl group, polyphenyl group, naphthyl group, fluoro (F) group, trifluoromethyl ($CF_3$) group, and the like can be given.

As examples of a blue emitting ligand, the following compounds and the like can be given.

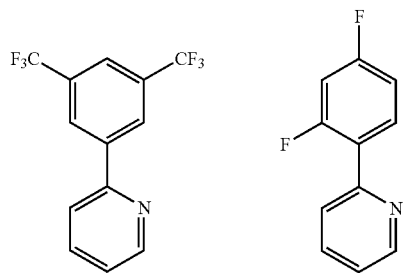

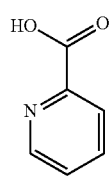

In the organic EL device according to the invention, it is preferable that at least one of the emitting layers include a plurality of luminescent dopants in order to realize a device exhibiting a high current efficiency.

It is preferable that the emitting layer nearest to the cathode include a first dopant different from the luminescent dopant. The first dopant need not emit light and is not particularly limited insofar as the first dopant is an organic compound which improves injection of electrons into the emitting layer. As the first dopant, an organic compound having an electron-attracting substituent (e.g. cyano group (CN), nitro group ($NO_2$), or quinolyl group) is preferable.

As specific examples of such an organic compound, nitrogen-containing organic compounds (e.g. oxazole derivatives) and fluorine-substituted compounds thereof, compounds having a Cz-hetero ring (Cz: carbazolyl group) disclosed in Japanese Patent Application No. 2002-071398, Japanese Patent Application No. 2002-081234, Japanese Patent Application No. 2002-299814, and Japanese Patent Application No. 2002-360134, hydrocarbon organic compounds (e.g. alkyl-substituted compound of styryl derivative), electron-attracting group substituted hydrocarbons (e.g. cyano group, fluoro group, pyridyl group, pyrazinyl group, pyrimidinyl group, or pyridanyl group derivative of styryl derivative), metal complexes, and the like can be given. Of these, the metal complexes are preferable.

As specific examples of preferable metal complexes, organic compounds disclosed in JP-A-5-258860 and compounds shown by the following formula (1) can be given.

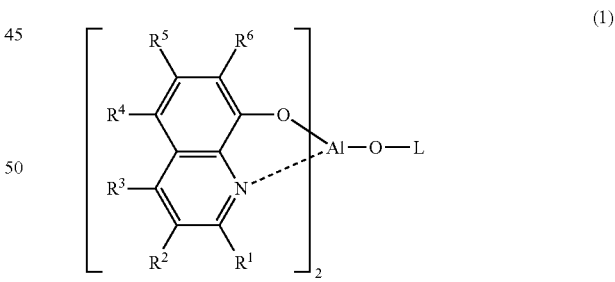

(1)

wherein $R^1$ represents an alkyl group, oxy group, or amino group, $R^2$ and $R^3$ individually represent a hydrogen atom, an alkyl group, oxy group, or amino group, $R^4$, $R^5$, and $R^6$ individually represent a hydrogen atom, an alkyl group, oxy group, amino group, cyano group, halogen group, α-haloalkyl group, α-haloalkoxy group, amide group, or sulfonyl group, and L represents a group shown by the following formula (2) or (3).

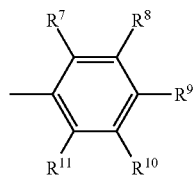

(2)

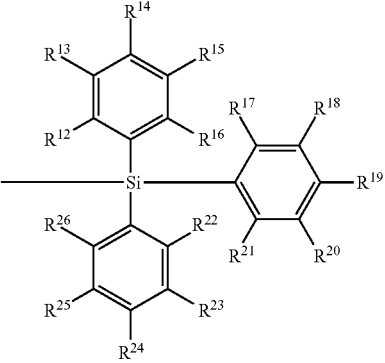

(3)

wherein $R^7$ to $R^{26}$ individually represent a hydrogen atom or a hydrocarbon group.

Specific examples of the metal complex shown by the formula (1) are given below.

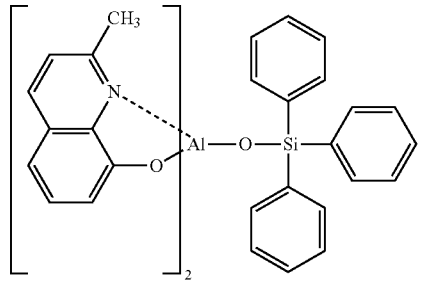

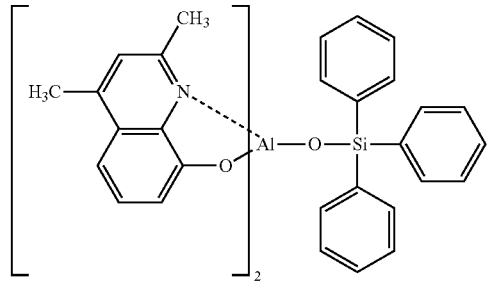

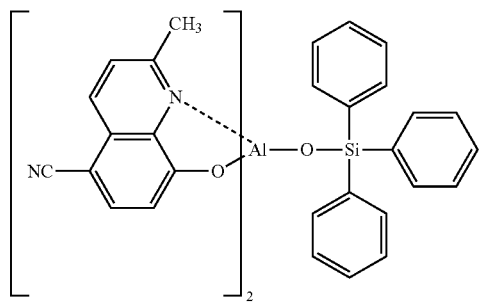

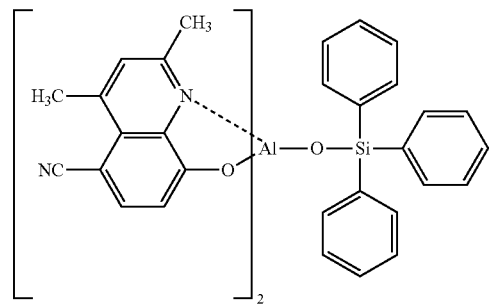

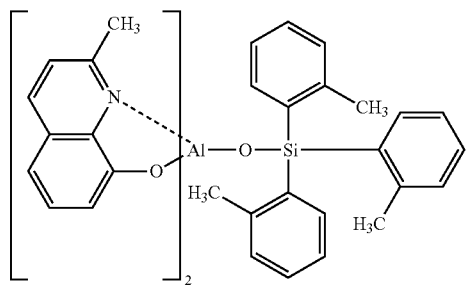

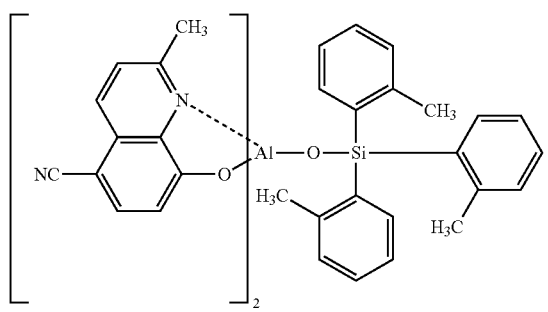

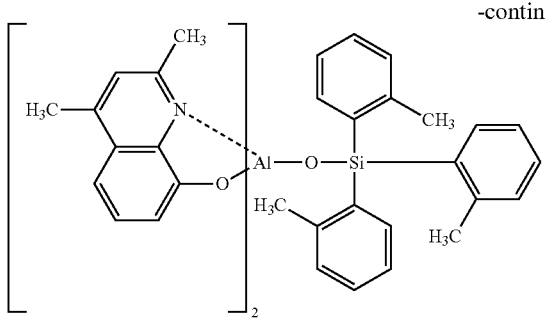
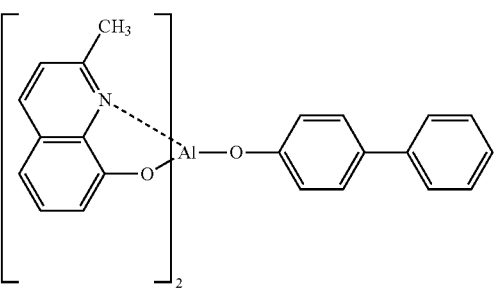

When the device includes an electron transporting layer, it is preferable that the electron affinity of the first dopant be in a range between the electron affinity of the electron transporting material forming the electron transporting layer and the electron affinity of the host material of the emitting layer nearest to the cathode. When the device does not include an electron transporting layer, it is preferable that the electron affinity of the first dopant be in a range between the work function of the cathode material and the electron affinity of the host material of the emitting layer nearest to the cathode. This configuration allows injection of electrons into the emitting layer to be improved, whereby the emission efficiency can be increased.

As examples of the electron transporting material, the metal complexes shown by the above formula (1), organic compounds disclosed in Japanese Patent Application No. 2002-071398, Japanese Patent Application No. 2002-081234, Japanese Patent Application No. 2002-299814, and Japanese Patent Application No. 2002-360134, and the like can be given.

A compound having a carbazolyl group may also be used as the electron transporting material. Specific examples of such a compound are given below.

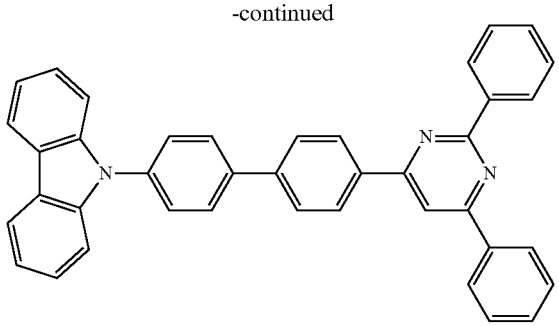
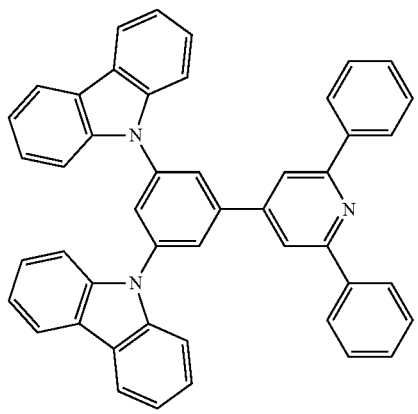
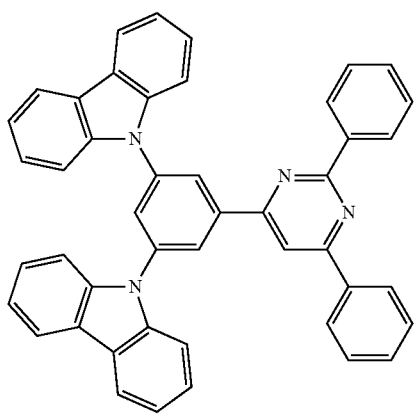
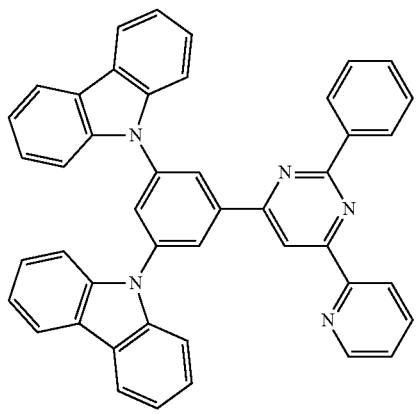

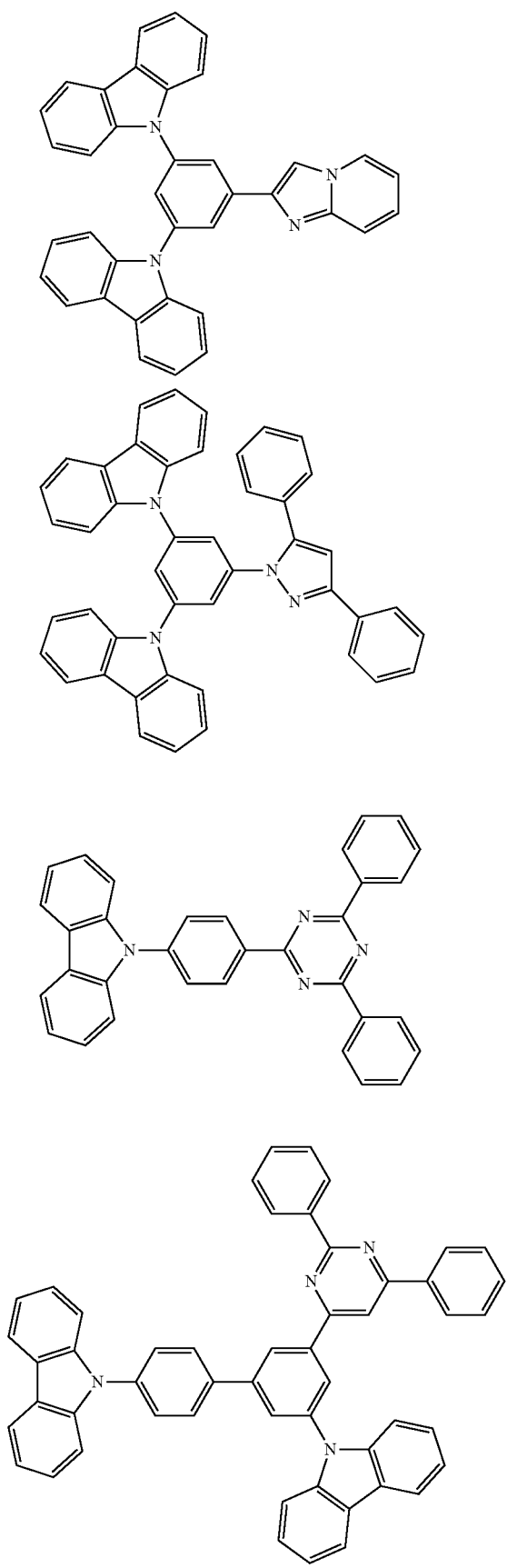
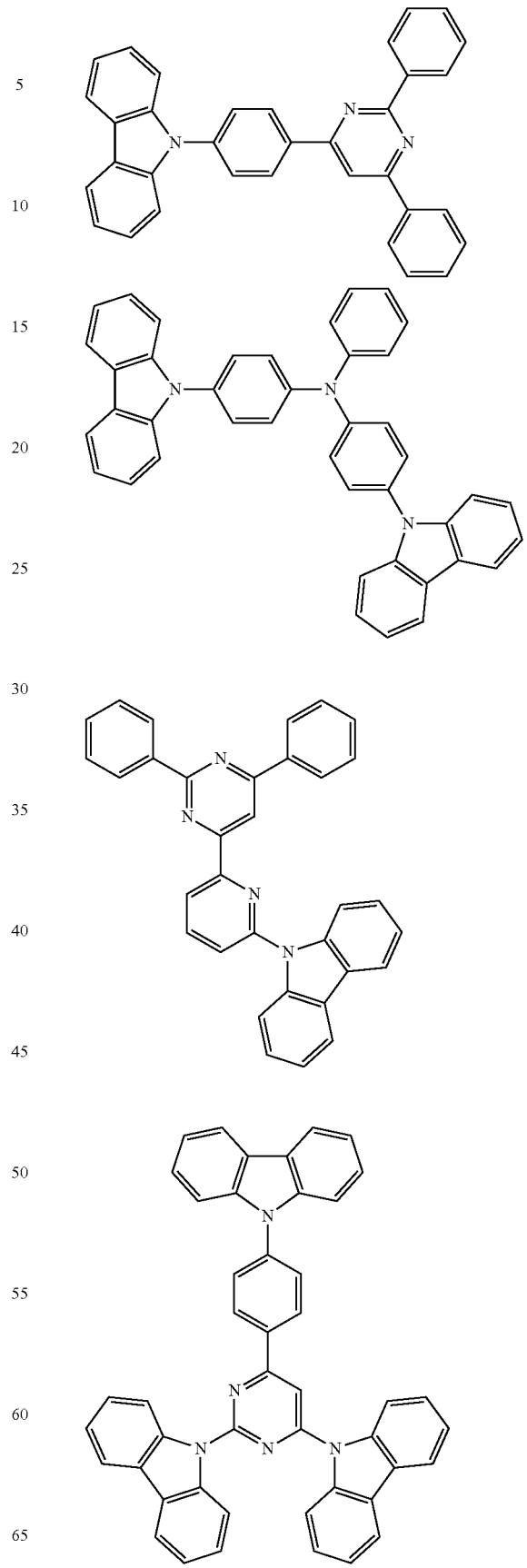

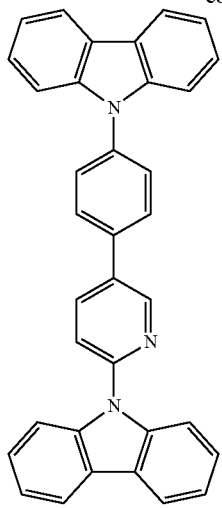
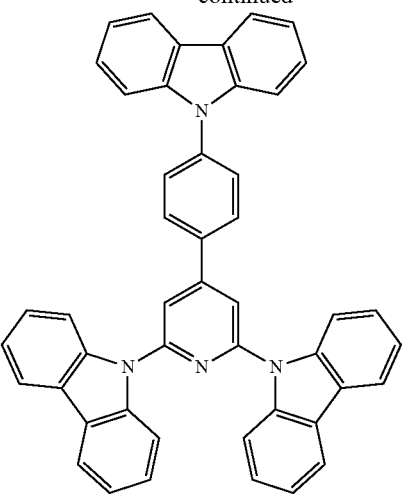
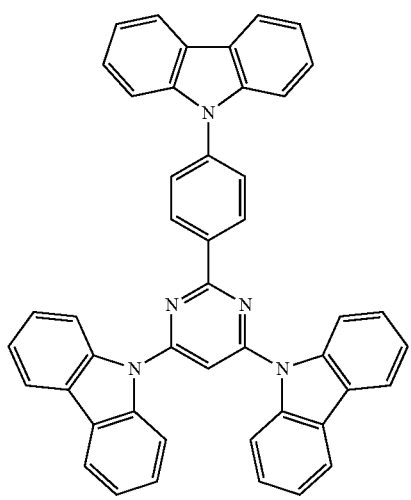
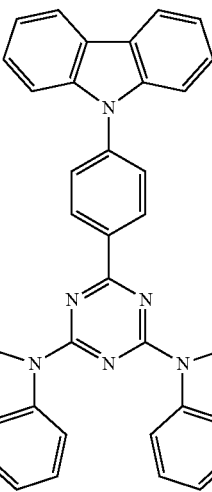
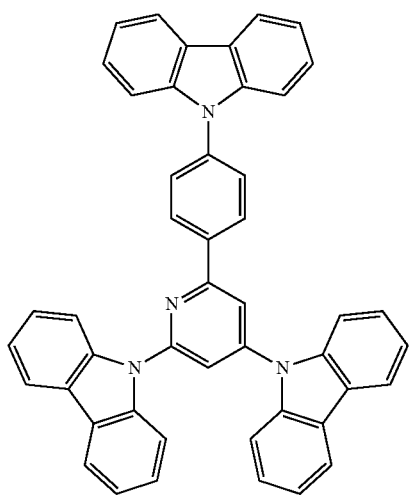
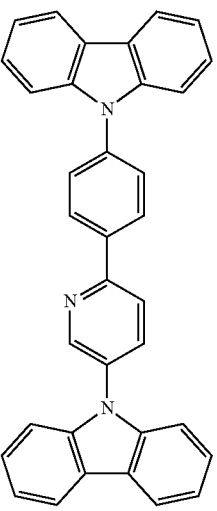

-continued

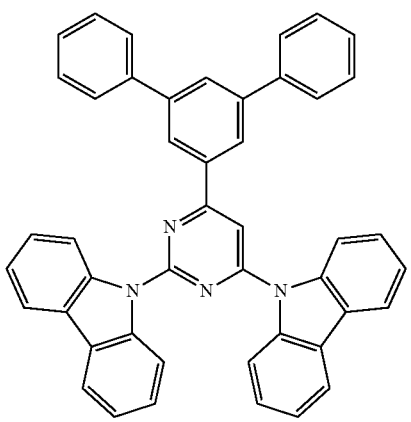

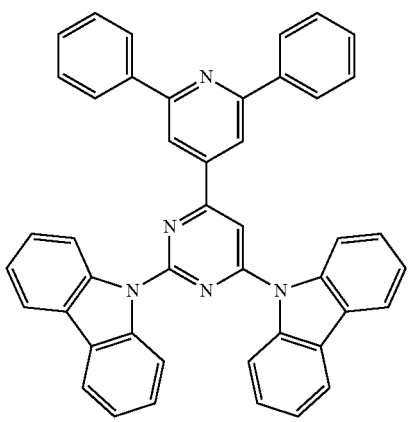

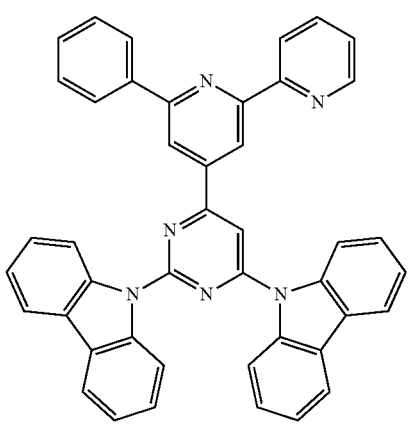

-continued

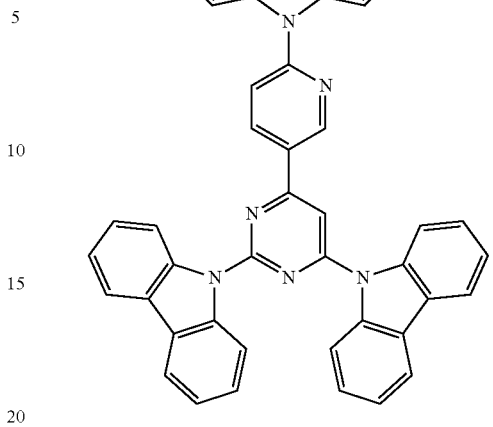

As examples of the configuration of the organic EL device according to the invention, the following configurations (a) to (g) can be given.

(a) Anode/multi-layered emitting layer/electron-transporting layer/cathode (b) Anode/hole-transporting layer/multi-layered emitting layer/electron-transporting layer/cathode (c) Anode/hole-injecting layer/hole-transporting layer/multi-layered emitting layer/electron-transporting layer/cathode (d) Anode/emitting layer/organic layer/emitting layer/electron-transporting layer/cathode (e) Anode/multi-layered emitting layer/organic layer/multi-layered emitting layer/electron-transporting layer/cathode (f) Anode/hole-transporting layer/multi-layered emitting layer/organic layer/multi-layered emitting layer/electron-transporting layer/cathode (g) Anode/hole-injecting layer/hole-transporting layer/multi-layered emitting layer/organic layer/multi-layered emitting layer/electron-transporting layer/cathode The emitting layer in the organic EL device according to the invention is defined as an organic layer containing the above luminescent dopant. The concentration of the luminescent dopant added is not particularly limited. It is preferably 0.1 to 30 wt %, and more preferably 0.1 to 10 wt %.

The organic EL device according to the invention is preferably supported by a substrate. The layers may be stacked on the substrate in the order from the anode to the cathode, or may be stacked on the substrate in the order from the cathode to the anode.

It is preferable that at least one of the anode and the cathode be formed of a transparent or translucent substance in order to efficiently out-couple light from the emitting layer.

The material for the substrate used in the invention is not particularly limited. A known material used for an organic EL device such as glasses, transparent plastics, or quartz may be used.

As the material for the anode used in the invention, a metal, alloy, or electric conductive compound having a work function as large as 4 eV or more, or a mixture of these materials is preferably used. As specific examples of such a material, metals such as Au and dielectric transparent materials such as CuI, ITO, $SnO_2$, and ZnO can be given.

The anode may be formed by forming a thin film of the above-mentioned material by deposition, sputtering method, or the like.

When out-coupling light from the emitting layer through the anode, it is preferable that the anode have a transparency of more than 10%.

The sheet resistance of the anode is preferably several hundreds ohm/square or less.

The thickness of the anode is usually 10 nm to 1 micron, and preferably 10 to 200 nm, although the thickness varies depending on the material.

As the material for the cathode used in the invention, a metal, alloy, or electric conductive compound having a work function as small as 4 eV or less, or a mixture of these materials is preferably used. As specific examples of such a material, sodium, lithium, aluminum, magnesium/silver mixture, magnesium/copper mixture, $Al/Al_2O_3$, indium, and the like can be given.

The cathode may be formed by forming a thin film of the above-mentioned material by deposition, sputtering, or the like.

When outcoupling light from the emitting layer through the cathode, it is preferable that the cathode have a transparency of more than 10%.

The sheet resistance of the cathode is preferably several hundreds ohm/square or less.

The thickness of the cathode is usually 10 nm to 1 micron, and preferably 50 to 200 nm, although the thickness varies depending on the material.

In the organic EL device according to the invention, a hole-injecting layer, a hole-transporting layer, an electron-injecting layer, and the like may be provided, as required, in order to further increase current (or luminous) efficiency. The materials for these layers are not particularly limited. A known organic material for an organic EL may be used. As specific examples of such a material, amine derivatives, stilbene derivatives, silazane derivatives, polysilane, aniline copolymers, and the like can be given.

Hole-transporting materials include compounds mentioned in Japanese Patent Application Nos. 2002-071397, 2002-080817, 2002-083866, 2002-087560, 2002-305375 and 2002-360134.

In the invention, it is preferable to add an inorganic material to the hole-injecting layer, the hole-transporting layer, the electron-injecting layer or the electron-transporting layer. As examples of the inorganic material, metal oxides and the like can be given.

An inorganic material may be preferably used for the hole-injecting layer or the hole-transporting layer.

An inorganic material may be used between the electron-transporting layer and the metal cathode in order to increase current (or luminous) efficiency. As specific examples of the inorganic material, fluorides and oxides of alkali metals such as Li, Mg, and Cs can be given.

The method of fabricating the organic EL device according to the invention is not particularly limited. The organic EL device according to the invention may be fabricated using a known fabrication method used for an organic EL device. In more detail, each layer may be formed by vacuum deposition, casting, coating, spin coating, or the like. Each layer may also be formed by casting, coating, or spin coating using a solution prepared by dispersing an organic material for each layer in a transparent polymer such as polycarbonate, polyurethane, polystyrene, polyallylate, or polyester, as well as simultaneous deposition of an organic material and a transparent polymer.

EXAMPLES

The invention is described below in more detail by way of examples. Note that the invention is not limited to the following examples.

Compounds used in the examples were produced by the methods disclosed in JP-A-10-237438, Japanese Patent Application Nos. 2003-042625, 2002-071398, 2002-081234, 2002-299814, 2002-360134, 2002-071397, 2002-080817, 2002-083866, 2002-087560, and 2002-305375.

The parameters shown in the table were measured by the following methods.

(1) Ionization Potential (Ip)

Light (excitation light) from a deuterium lamp dispersed by a monochromator was irradiated to a material, and the resulting photoelectric emission was measured using an electrometer. The ionization potential was determined by calculating the photoelectric emission threshold value from the photoelectric emission photon energy curve obtained using an extrapolation method. As the measuring instrument, an atmosphere ultraviolet photoelectron spectrometer "AC-1" (manufactured by Riken Keiki Co., Ltd.) was used.

(2) Optical Energy Gap (Eg)

Light of which the wavelength was resolved was irradiated to a toluene diluted solution of each material, and the optical energy gap was determined by conversion from the maximum wavelength of the absorption spectrum. As the measuring instrument, a spectrophotometer ("U-3400" manufactured by Hitachi, Ltd.) was used.

(3) Triplet Energy Gap ($Eg^T$)

The triplet energy gap ($Eg^T$ (Dopant)) was determined by the following method. An organic material was measured by a known phosphorescence measurement method (e.g. method described in "The World of Photochemistry" (edited by The Chemical Society of Japan, 1993), page 50). In more detail, an organic material was dissolved in a solvent (sample 10 micromol/l, EPA (diethyl ether:isopentane:ethanol=5:5:2 (volume ratio), each solvent was spectrum grade) to obtain a phosphorescence measurement sample. After cooling the sample placed in a quartz cell to 77K, excitation light was irradiated to the sample, and the resulting phosphorescence was measured with respect to the wavelength. A tangent was drawn to the rise of the phosphorescence spectrum on the shorter wavelength side, and the value obtained by converting the wavelength into the energy value was taken as the triplet energy gap ($Eg^T$). The triplet energy gap was measured using a "F-4500" fluorescence spectrophotometer (manufactured by Hitachi, Ltd.) and optional low temperature measurement equipment. Note that the measuring instrument is not limited thereto. The triplet energy gap may be measured by combining a cooling device, a low temperature container, an excitation light source, and a light receiving device.

In the examples, the wavelength was converted using the following expression.

$$Eg^T(eV)=1239.85/\lambda_{edge}$$

The meaning of "$\lambda_{edge}$" is as follows. When the phosphorescence spectrum is expressed in which the vertical axis indicates the phosphorescence intensity and the horizontal axis indicates the wavelength, and a tangent is drawn to the rise of the phosphorescence spectrum on the shorter wavelength side, "$\lambda_{edge}$" is the wavelength at the intersection of the tangent and the horizontal axis. The unit for "$\lambda_{edge}$" is nm.

(4) Electron Affinity (Af)

The electron affinity was calculated from the expression Af=Ip−Eg, using the measured values, Ip and Eg.

Example 1

An organic EL device shown in FIG. 1 was fabricated as follows.

A glass substrate 11, measuring 25 mm×75 mm×1.1 mm thick, with an ITO transparent electrode (anode) 12 (manufactured by Geomatics Co.) was subjected to ultrasonic cleaning in isopropyl alcohol for 5 minutes and then to UV ozone cleaning for 30 minutes. The cleaned glass substrate 11 with transparent electrode lines was mounted on a substrate holder in a vacuum deposition device. First, a 100 nm thick film of N,N'-bis(N,N'-diphenyl-4-aminophenyl)-N,N-diphenyl-4,4'-diamino-1,1'-biphenyl (hereinafter referred to as TPD 232 film) 13 was formed by resistance heating deposition on the surface where the transparent electrode lines were formed, so as to cover the transparent electrode 12. This TPD 232 film 13 functioned as a hole-injecting layer (a hole-transporting layer).

After the formation of the TPD 232 film 13, a 10 nm thick hole-transporting layer (hereinafter referred to as HTM) 14 was formed by resistance heating deposition. After the formation of the hole-transporting layer 14, a host material 1 (Host No. 1, Eg=3.53 eV, $Eg^T$=2.86 eV, Ip=5.59 eV, Af=2.06 eV) and a luminescent dopant (FIrpic, Eg=2.8 eV, $Eg^T$=2.7 eV, Ip=5.6 eV, Af=2.8 eV, shown below) were co-deposited by resistance heating to form a 20 nm thick film 15 thereon. The concentration of FIrpic was 7.5 wt %. This Host No. 1: FIrpic film 15 functioned as an emitting layer.

A 1 nm thick layer 16 made of the host material 1 was formed on this film. The film 16 functioned as a charge adjustment layer, whereby an electric charge can be accumulated well in the emitting layer and a current efficiency of the device increases.

Moreover, a host material 2 (Host No. 2, Eg=3.55 eV, $Eg^T$=2.90 eV, Ip=5.71 eV, Af=2.16 eV) and FIrpic were co-deposited by resistance heating to form a 20 nm thick film 17 thereon. The concentration of FIrpic was 7.5 wt %. This Host No. 2: FIrpic film 17 functioned as an emitting layer.

Thereafter, a 0.1 nm thick electron-injecting electrode (cathode) 18 of LiF was formed at a film-formation rate of 1 Å/minute. A metal Al (work function: 4.2 eV) was deposited on the LiF layer 18 to form a 130 nm thick metal cathode 19, thereby fabricating an organic EL device 100.

HTM

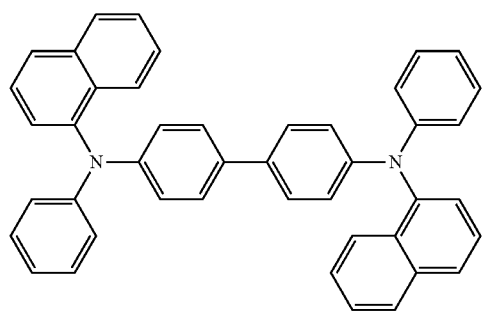

-continued

Host No. 1

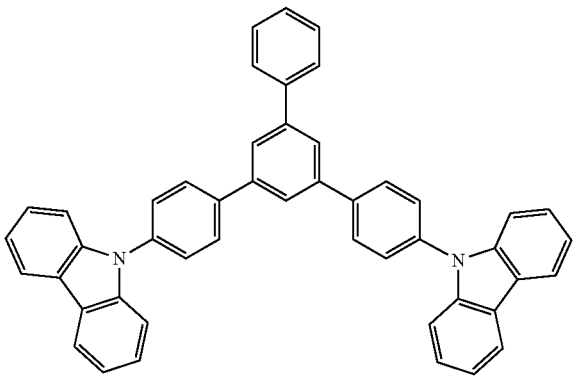

Host No. 2

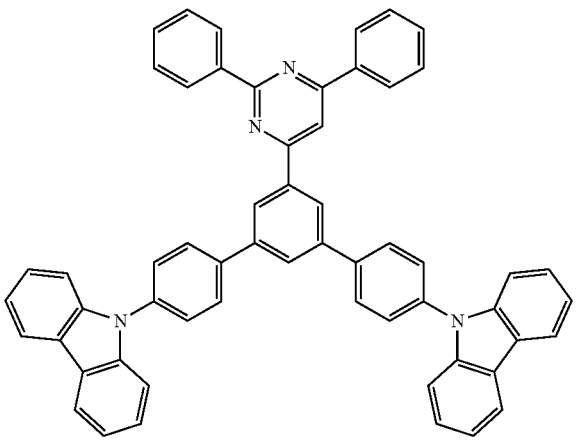

FIrpic

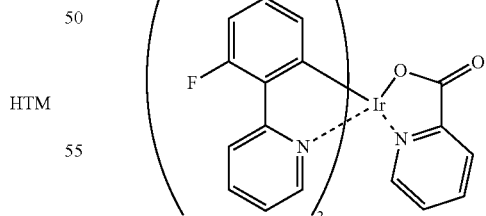

Example 2

An organic EL device was fabricated in the same manner as in Example 1 except that the following PC-8 was introduced by resistance heating deposition to a thickness of 30 nm as an electron-transporting layer on an emitting layer made of the host material 2: FIrpic.

PC-8

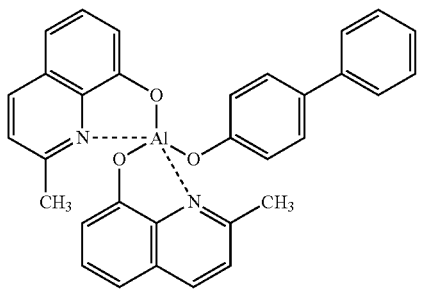

Example 3

Figure 2:
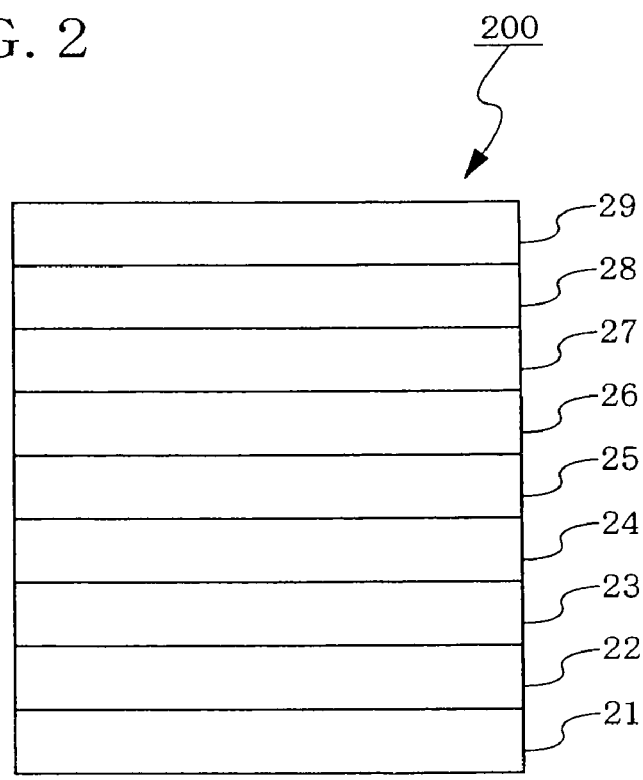
FIG. 2 is a view showing an organic EL device according to Example 3.

An organic EL device shown in FIG. 2 was fabricated as follows.

A glass substrate 21, measuring 25 mm×75 mm×1.1 mm thick, with an ITO transparent electrode (anode) 22 (manufactured by Geomatics Co.) was subjected to ultrasonic cleaning in isopropyl alcohol for 5 minutes and then to UV ozone cleaning for 30 minutes. The cleaned glass substrate 21 with transparent electrode lines was mounted on a substrate holder in a vacuum deposition device. First, a 100 nm thick TPD 232 film 23 was formed by resistance heating deposition on the surface where the transparent electrode lines were formed, so as to cover the transparent electrode 22. The TPD 232 film 23 functioned as a hole-injecting (hole-transporting) layer.

After the formation of the TPD 232 film 23, a 10 nm thick hole-transporting layer (HTM) 24 was formed by resistance heating deposition. After the formation of the hole-transporting layer 24, a host material 1 and FIrpic were co-deposited by resistance heating to form a 20 nm thick emitting layer 25 (emitting layer) thereon. The concentration of FIrpic was 7.5 wt %.

After the formation of the TPD 232 film 23, a host material 3 (Host No. 3, Eg=3.55 eV, $Eg^T$=2.91 eV, Ip=5.40 eV, Af=1.85 eV) and FIrpic were co-deposited by resistance heating to form a 20 nm thick film 26 thereon. The concentration of FIrpic was 7.5 wt %. This Host No. 3: FIrpic film 26 functioned as an emitting layer.

Host No. 3

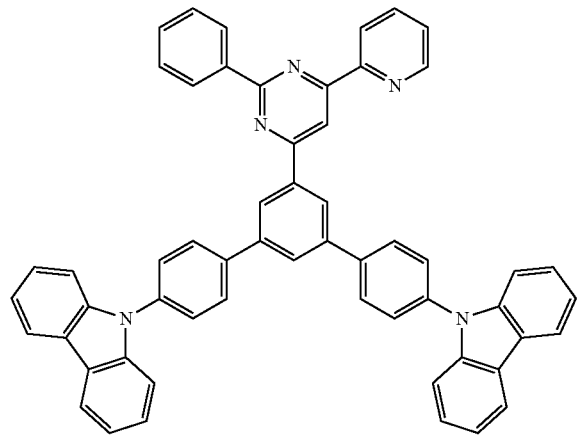

Then, a 30 nm thick electron-transporting layer 27 (PC-8) was formed by resistance heating deposition on the emitting layer 26.

Thereafter, a 0.1 nm thick electron-injecting electrode (cathode) 28 of LiF was formed at a film-formation rate of 1 Å/minute. A metal Al was deposited on the LiF layer 28 to form a 130 nm thick metal cathode 29, thereby fabricating an organic EL device 200.

Example 4

A glass substrate, measuring 25 mm×75 mm×1.1 mm thick, with an ITO transparent electrode (manufactured by Geomatics Co.) was subjected to ultrasonic cleaning in isopropyl alcohol for 5 minutes and then to UV ozone cleaning for 30 minutes. The cleaned glass substrate with transparent electrode lines was mounted on a substrate holder in a vacuum deposition device. First, a 100 nm thick TPD 232 film was formed by resistance heating deposition on the surface where the transparent electrode lines were formed, so as to cover the transparent electrode. The TPD 232 film functioned as a hole-injecting (hole-transporting) layer.

After the formation of the TPD 232 film, a 10 nm thick hole-transporting layer (HTM) was formed by resistance heating deposition thereon.

After the formation of the hole-transporting layer, the host material 1 and FIrpic were co-deposited by resistance heating to form a 20 nm thick film (emitting layer) thereon. The concentration of FIrpic was 7.5 wt %.

Moreover, a host material 4 (Host No. 4, Eg=3.16 eV, $Eg^T$=2.78 eV, Ip=5.84 eV, Af=2.66 eV) and FIrpic were co-deposited by resistance heating to form a 20 nm thick film thereon. The concentration of FIrpic was 7.5 wt %. This Host No. 4: FIrpic film functioned as an emitting layer.

Host No. 4

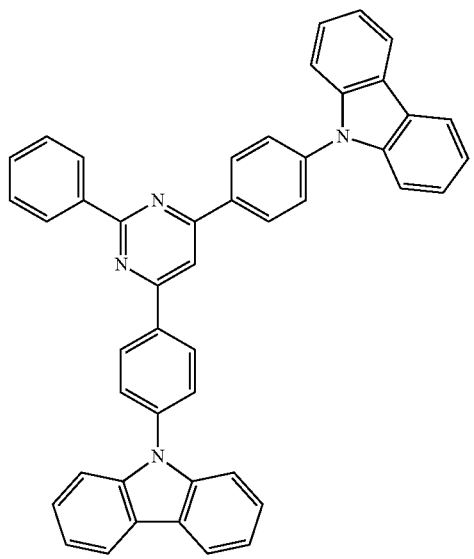

Then, a 30 nm thick electron-transporting layer (Alq, Af=3.0 eV, shown below) was formed by resistance heating deposition on the emitting layer.

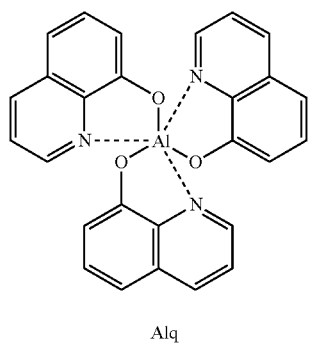

Alq

Thereafter, a 0.1 nm thick electron-injecting electrode (cathode) of LiF was formed at a film-formation rate of 1 Å/minute. A metal Al was deposited on the LiF layer to form a 130 nm thick metal cathode, thereby fabricating an organic EL device.

Example 5

A device was fabricated by the same steps as in Example 4 except that the host material 4 was changed to a host material (Host No. 5, Eg=3.57 eV, $Eg^T$=2.89 eV, Ip=5.60 eV, Af=2.03 eV).

Host No. 5

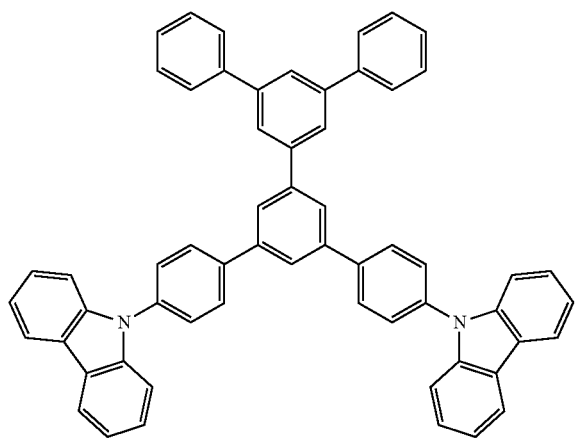

Example 6

A device was fabricated by the same steps as in Example 4 except that the host material 4 was changed to a host material 6 (Host No. 6, Eg=3.56 eV, $Eg^T$=2.87 eV, Ip=5.85 eV, Af=2.29 eV).

Host No. 6

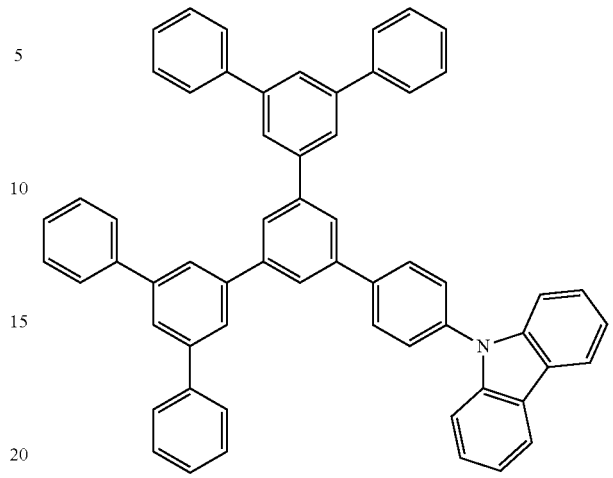

Example 7

A device was fabricated by the same steps as in Example 3 except that the host material 1 was changed to the host material 3 and the host material 3 to the host material 4 respectively.

Example 8

A glass substrate, measuring 25 mm×75 mm×1.1 mm thick, with an ITO transparent electrode (manufactured by Geomatics Co.) was subjected to ultrasonic cleaning in isopropyl alcohol for 5 minutes and then to UV ozone cleaning for 30 minutes. The cleaned glass substrate with transparent electrode lines was mounted on a substrate holder in a vacuum deposition device. First, a 100 nm thick TPD 232 film was formed by resistance heating deposition on the surface where the transparent electrode lines were formed, so as to cover the transparent electrode. The TPD 232 film functioned as a hole-injecting (hole-transporting) layer.

After the formation of the TPD 232 film, a 10 nm thick hole-transporting layer (HTM) was formed by resistance heating deposition.

After the formation of the hole-transporting layer, a host material 1 and FIrpic were co-deposited by resistance heating to form a 30 nm thick film (emitting layer) thereon. The concentration of FIrpic was 7.5 wt %.

Moreover, the host material 1, FIrpic and PC-8 (Af=2.7 eV) were co-deposited by resistance heating to form a 10 nm thick film (emitting layer) thereon. The concentration of FIrpic and PC-8 each were 7.5 wt %.

Thereafter, a 0.1 nm thick electron-injecting electrode (cathode) of LiF was formed at a film-formation rate of 1 Å/minute. A metal Al (work function, 4.2 eV) was deposited on the LiF layer to form a 130 nm thick metal cathode, thereby fabricating an organic EL device.

Comparative Example 1

A glass substrate, measuring 25 mm×75 mm×1.1 mm thick, with an ITO transparent electrode (manufactured by Geomatics Co.) was subjected to ultrasonic cleaning in isopropyl alcohol for 5 minutes and then to UV ozone cleaning for 30 minutes. The cleaned glass substrate with transparent electrode lines was mounted on a substrate holder in a vacuum deposition device. First, a 100 nm thick TPD 232 film was formed by resistance heating deposition on the surface where the transparent electrode lines were formed, so as to cover the transparent electrode. The TPD 232 film functioned as a hole-injecting (hole-transporting) layer.

After the formation of the TPD 232 film, a 10 nm thick hole-transporting layer (HTM) was formed by resistance heating deposition.

After the formation of the hole-transporting layer, the host material 1 and FIrpic were co-deposited by resistance heating to form a 40 nm thick film thereon. The concentration of FIrpic was 7.5 wt %.

Moreover, an electron-transporting layer (Alq) with a certain thickness (30 nm) was formed by resistance heating deposition on the emitting layer.

Thereafter, a 0.1 nm thick electron-injecting electrode (cathode) of LiF was formed at a film-formation rate of 1 Å/minute. A metal Al was deposited on the LiF layer to form a 130 nm thick metal cathode, thereby fabricating an organic EL device.

(Evaluation of Organic EL Device)

A current density, luminance, efficiency and chromaticity of the organic EL devices obtained in the examples and the comparative example were measured by applying a certain DC voltage. A current efficiency (=O (luminance)/(current density)) at a luminance of about 100 cd/m² was calculated. The results were shown in Table 1.

TABLE 1

| | Voltage (V) | Current density (mA/cm²) | CIE- (x, y) | Current efficiency (cd/A) | Luminous efficiency (lm/W) |
|---|---|---|---|---|---|
| Example 1 | 9.0 | 0.45 | (0.180, 0.431) | 22.2 | 7.76 |
| Example 2 | 8.0 | 0.4 | (0.175, 0.431) | 25 | 9.8 |
| Example 3 | 7.5 | 0.4 | (0.175, 0.431) | 25 | 10.4 |
| Example 4 | 8.5 | 0.4 | (0.175, 0.431) | 25 | 9.2 |
| Example 5 | 8.0 | 0.45 | (0.175, 0.431) | 22.2 | 8.73 |
| Example 6 | 8.3 | 0.4 | (0.175, 0.431) | 25 | 9.46 |
| Example 7 | 7.0 | 0.38 | (0.175, 0.431) | 26.3 | 11.8 |
| Example 8 | 8.5 | 0.5 | (0.175, 0.431) | 20 | 7.4 |
| Comparative Example 1 | 8.0 | 1.01 | (0.20, 0.41) | about 10 | 3.9 |

The results reveal that the invention realized a device with a higher current efficiency than conventional devices which have the same emission color.

INDUSTRIAL APPLICABILITY

The organic EL device of the invention can be used for an information display device, a display device for automobiles, a lighting and so on because its luminous efficiency is high at a high luminance and the electric power consumption is low. Specifically, it can be suitably used for a flat luminescent body for wall hanging TVs, a back lighting source for displays and so on.

The contents of the documents and publications cited in the description are incorporated herein by reference.

The invention claimed is:

1. An organic electroluminescent device comprising a plurality of emitting layers and a charge adjustment layer between a cathode and an anode, each of the emitting layers comprising a host material having a triplet energy gap of 2.52 eV or more and 3.7 eV or less, and a dopant having a light emitting property related to a triplet state, the dopant comprising a metal complex with a heavy metal, and the charge adjustment layer being between emitting layers, wherein the material of the charge adjustment layer is the same as any one of the host materials of the plurality of emitting layers.

2. The organic electroluminescent device according to claim 1, wherein the host materials of the emitting layers differ from each other.

3. The organic electroluminescent device according to claim 1, wherein the host material of at least one of the emitting layers is an organic compound containing a carbazolyl group.

4. An organic electroluminescent device comprising a plurality of emitting layers and a charge adjustment layer between a cathode and an anode, each of the emitting layers comprising a host material having a triplet energy gap of 2.52 eV or more and 3.7 eV or less, and a dopant having a light emitting property related to a triplet state, the dopant comprising a metal complex with a heavy metal, and the charge adjustment layer being between emitting layers, wherein the host material of at least one of the emitting layers is an organic compound containing a carbazolyl group and a trivalent hetero ring containing nitrogen.

5. The organic electroluminescent device according to claim 1, wherein the host materials forming the emitting layers differ from each other in ionization potential or electron affinity.

6. The organic electroluminescent device according to claim 1, wherein the host materials of the emitting layers differ from each other in ionization potential or electron affinity by 0.2 eV or more.

7. The organic electroluminescent device according to claim 1, wherein the optical energy gap of the host material forming an emitting layer is equal to or smaller than the optical energy gap of the host material forming the emitting layer adjacent in a direction of the anode.

8. The organic electroluminescent device according to claim 1, wherein an emitting layer comprising a host material with a superior hole-transporting property and an emitting layer comprising a host material with a superior electron-transporting property are stacked.

9. The organic electroluminescent device according to claim 1, wherein at least one of the emitting layers comprises plural types of the dopants having a light emitting property related to a triplet state.

10. The organic electroluminescent device according to claim 1, wherein the emitting layer nearest to the cathode comprises a first dopant that is different from the dopant having a light emitting property related to a triplet state.

11. The organic electroluminescent device according to claim 10, wherein the first dopant is a metal complex.

12. An organic electroluminescent device comprising a plurality of emitting layers and a charge adjustment layer between a cathode and an anode, each of the emitting layers comprising a host material having a triplet energy gap of 2.52 eV or more and 3.7 eV or less, and a dopant having a light emitting property related to a triplet state, the dopant comprising a metal complex with a heavy metal, and the charge adjustment layer being between emitting layers, wherein the emitting layer nearest to the cathode comprises a first dopant that is different from the dopant having a light emitting property related to a triplet state, and wherein when the device comprises an electron-transporting layer, the electron affinity of the first dopant is in a range between the electron affinity of an electron-transporting material forming the electron-transporting layer and the electron affinity of the host material of the emitting layer nearest to the cathode, and when the device does not comprise an electron-transporting layer, the electron affinity of the first dopant is in a range between the work function of a cathode material and the electron affinity of the host material of the emitting layer nearest to the cathode.

* * * * *